(12) United States Patent
Yun et al.

(10) Patent No.: US 11,489,143 B2
(45) Date of Patent: Nov. 1, 2022

(54) DISPLAY DEVICE INCLUDING REFRACTIVE LAYER ON PIXEL DEFINING LAYER

(71) Applicant: Samsung Display Co., Ltd., Yongin-si (KR)

(72) Inventors: Haeyoung Yun, Suwon-si (KR); Soon Il Jung, Cheonan-si (KR); Jung-Hyun Cho, Seoul (KR); Sang-Hyun Choi, Seoul (KR); Beohm-Rock Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 246 days.

(21) Appl. No.: 15/931,356

(22) Filed: May 13, 2020

(65) Prior Publication Data

US 2021/0066667 A1 Mar. 4, 2021

(30) Foreign Application Priority Data

Sep. 4, 2019 (KR) .................. 10-2019-0109408

(51) Int. Cl.
*H01L 51/52* (2006.01)
*H01L 27/32* (2006.01)

(52) U.S. Cl.
CPC ........ *H01L 51/5275* (2013.01); *H01L 27/323* (2013.01); *H01L 27/3218* (2013.01); *H01L 27/3246* (2013.01); *H01L 51/5253* (2013.01); *H01L 51/5281* (2013.01)

(58) Field of Classification Search
USPC ........................................... 257/40
See application file for complete search history.

(56) References Cited

U.S. PATENT DOCUMENTS

| 6,072,450 | A | 6/2000 | Yamada et al. |
| 7,535,646 | B2 | 5/2009 | Chari et al. |
| 9,142,802 | B2 | 9/2015 | Miyamoto et al. |
| 10,050,236 | B2 | 8/2018 | Chen et al. |
| 2006/0290274 | A1* | 12/2006 | Oota ............ H05B 33/22 313/506 |
| 2011/0024857 | A1* | 2/2011 | Toumiya ........ H01L 27/14629 257/E31.127 |

(Continued)

FOREIGN PATENT DOCUMENTS

KR 10-2018-0005323 A 1/2018

*Primary Examiner* — Nduka E Ojeh
(74) *Attorney, Agent, or Firm* — Lewis Roca Rothgerber Christie LLP

(57) ABSTRACT

A display device includes: a pixel defining layer on a pixel electrode, and having a pixel opening exposing a portion of the pixel electrode; an emission layer on the pixel electrode at the pixel opening; an opposite electrode on the emission layer; a first refractive layer on the opposite electrode, and having a first refractive index, and a refractive opening that overlaps with the pixel opening; and a second refractive layer on the first refractive layer, and having a second refractive index greater than the first refractive index. A minimum gap between the pixel opening and the refractive opening in a plan view is greater than or equal to −1 µm and less than or equal to 2.5 µm, and a width of the refractive opening is less than a width of the pixel opening when the minimum gap is negative, and greater when the minimum gap is positive.

19 Claims, 9 Drawing Sheets

(56) References Cited

U.S. PATENT DOCUMENTS

| | | | |
|---|---|---|---|
| 2015/0008399 A1* | 1/2015 | Choi | H01L 51/5275 |
| | | | 257/40 |
| 2015/0333108 A1 | 11/2015 | Miyamoto et al. | |
| 2016/0266296 A1* | 9/2016 | Son | H01L 51/5237 |
| 2018/0138458 A1* | 5/2018 | Tokuda | H01L 51/524 |
| 2019/0013495 A1 | 1/2019 | Kim et al. | |
| 2019/0165061 A1 | 5/2019 | Jung et al. | |
| 2021/0005846 A1* | 1/2021 | Kim | H01L 51/5253 |
| 2021/0050557 A1* | 2/2021 | Yun | H01L 51/5275 |

* cited by examiner

DISPLAY DEVICE INCLUDING REFRACTIVE LAYER ON PIXEL DEFINING LAYER

CROSS-REFERENCE TO RELATED APPLICATION

This application claims priority to and the benefit of Korean Patent Application No. 10-2019-0109408 filed on Sep. 4, 2019 in the Korean Intellectual Property Office (KIPO), the entire disclosure of which is incorporated by reference herein.

BACKGROUND

1. Field

Aspects of embodiments of the present disclosure relate to a display device. More particularly, aspects of embodiments of the present disclosure relate to a display device having improved light efficiency.

2. Description of the Related Art

An organic light emitting display device is a self-emission type display device that displays an image using an organic light emitting diode that emits light. The organic light emitting diode may include two opposite electrodes and an emission layer formed therebetween. The organic light emitting display device may have various characteristics, such as low power consumption, high brightness, fast response speed, and/or the like, and thus, the organic light emitting display device has drawn attention as a next-generation display device.

In the organic light emitting display device, it may be generally desirable for light generated from the emission layer to be directed towards a user. However, because light generated from the emission layer of the organic light emitting display device generally travels in a plurality of directions, including a front direction and a side direction, brightness at (e.g., in or on) the front direction at which the user is located may be low.

SUMMARY

One or more embodiments of the present disclosure are directed to a display device having improved light efficiency.

According to one or more example embodiments of the present disclosure, a display device includes: a pixel electrode; a pixel defining layer on the pixel electrode, and having a pixel opening that exposes at least a portion of the pixel electrode; an emission layer on the pixel electrode at the pixel opening; an opposite electrode on the emission layer; a first refractive layer on the opposite electrode, and having a first refractive index, and a refractive opening that overlaps with the pixel opening; and a second refractive layer on the first refractive layer, and having a second refractive index greater than the first refractive index. A minimum gap between the pixel opening and the refractive opening in a plan view is greater than or equal to −1 μm and less than or equal to 2.5 μm, and a width of the refractive opening is less than a width of the pixel opening when the minimum gap is negative, and the width of the refractive opening is greater than the width of the pixel opening when the minimum gap is positive.

In an example embodiment, a value obtained by subtracting the width of the pixel opening from the width of the refractive opening may be greater than or equal to −2 μm and less than or equal to 5 μm.

In an example embodiment, the refractive opening may have a planar shape same as a planar shape of the pixel opening.

In an example embodiment, the first refractive layer may include a photoresist.

In an example embodiment, the first refractive layer may include acrylic resin.

In an example embodiment, the second refractive layer may include siloxane, and at least one from among zirconium oxide, aluminum oxide, and titanium oxide.

In an example embodiment, an upper surface of the second refractive layer may be planarized.

In an example embodiment, the display device may further include: a thin film encapsulation layer between the opposite electrode and the first refractive layer, and including a planarized upper surface.

In an example embodiment, the display device may further include: an input sensing layer between the thin film encapsulation layer and the first refractive layer, and the first refractive layer may cover the input sensing layer.

In an example embodiment, the display device may further include: a polarizing layer on the second refractive layer.

According to one or more example embodiments of the present disclosure, a display device includes: first to third pixel electrodes; a pixel defining layer on the first to third pixel electrodes, and having first to third pixel openings that expose the first to third pixel electrodes, respectively; first to third emission layers on the first to third pixel electrodes at the first to third pixel openings, respectively; an opposite electrode on the first to third emission layers; a first refractive layer on the opposite electrode, and having a first refractive index, and first to third refractive openings overlapping with the first to third pixel openings, respectively; and a second refractive layer on the first refractive layer and having a second refractive index greater than the first refractive index. Each of a first minimum gap between the first pixel opening and the first refractive opening in a plan view, a second minimum gap between the second pixel opening and the second refractive opening in a plan view, and a third minimum gap between the third pixel opening and the third refractive opening in a plan view is greater than or equal to −1 μm and less than or equal to 2.5 μm, and a width of each of the first to third refractive openings is less than a width of each of the first to third pixel openings corresponding thereto when the first to third minimum gaps are negative, and the width of each of the first to third refractive openings is greater than the width of each of the first to third pixel openings corresponding thereto when the first to third minimum gaps are positive.

In an example embodiment, at least one from among the first minimum gap, the second minimum gap, and the third minimum gap may be different from the others.

In an example embodiment, the first emission layer, the second emission layer, and the third emission layer may be configured to emit a red light, a green light, and a blue light, respectively.

In an example embodiment, the second minimum gap may be less than the first minimum gap.

In an example embodiment, the third minimum gap may be greater than the second minimum gap.

In an example embodiment, the third minimum gap may be less than or equal to the first minimum gap.

In an example embodiment, each of a value obtained by subtracting the width of the first pixel opening from the width of the first refractive opening, a value obtained by subtracting the width of the second pixel opening from the width of the second refractive opening, and a value obtained by subtracting the width of the third pixel opening from the width of the third refractive opening may be greater than or equal to −2 µm and less than or equal to 5 µm.

In an example embodiment, each of the first to third refractive openings may have a planar shape same as a planar shape of each of the first to third pixel openings corresponding thereto.

According to one or more example embodiments of the present disclosure, a display device includes: a light emitting element; a pixel defining layer surrounding the light emitting element; a first refractive layer on the light emitting element and the pixel defining layer, the first refractive layer overlapping with the pixel defining layer, and having a first refractive index; and a second refractive layer on the first refractive layer, the second refractive layer overlapping with the light emitting element and the pixel defining layer, and having a second refractive index greater than the first refractive index. A minimum gap between an edge of the pixel defining layer and an edge of the first refractive layer in a plan view is greater than or equal to −1 µm and less than or equal to 2.5 µm, and a width of the first refractive layer is greater than a width of the pixel defining layer when the minimum gap is negative, and the width of the first refractive layer is less than the width of the pixel defining layer when the minimum gap is positive.

In an example embodiment, a value obtained by subtracting the width of the first refractive layer from the width of the pixel defining layer may be greater than or equal to −2 µm and less than or equal to 5 µm.

In the display device according to one or more example embodiments of the present disclosure, the minimum gap between the refractive opening of the first refractive layer and the pixel opening of the pixel defining layer may be greater than or equal to about −1 µm and less than or equal to about −2.5 µm. Accordingly, the front light efficiency of the display device may be improved compared to a display device that does not include the first refractive layer.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
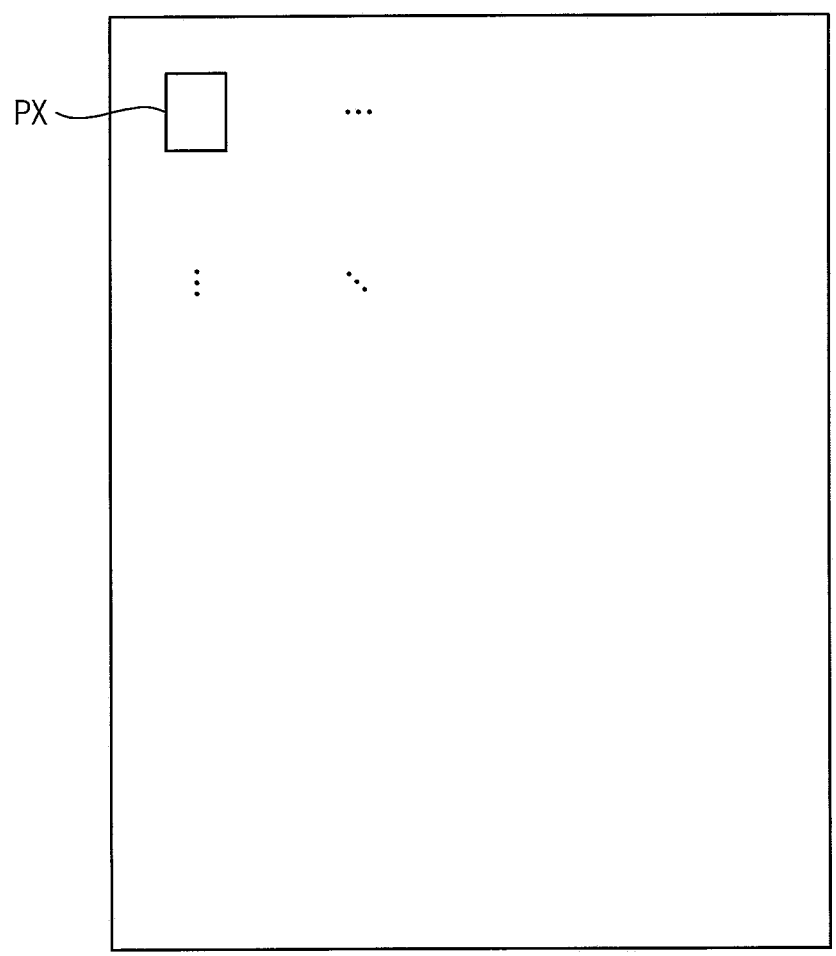
FIG. 1 is a plan view illustrating a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to an embodiment.

Referring to FIG. 1, a display device may include a plurality of pixels PX. The pixels PX may be arranged in a matrix form along a row direction and a column direction. The pixel PX may refer to a region formed by dividing a display area in a plan view to display a color image, and one pixel PX may be a smallest unit (e.g., a minimum unit) of the display device that may express a color independent from other pixels. As used herein, a plan view may be a view from a plane that is parallel to or substantially parallel to (e.g., normal to) a top surface of the display device. The display device may display an image formed by light emitted from the plurality of pixels PX.

Figure 2:
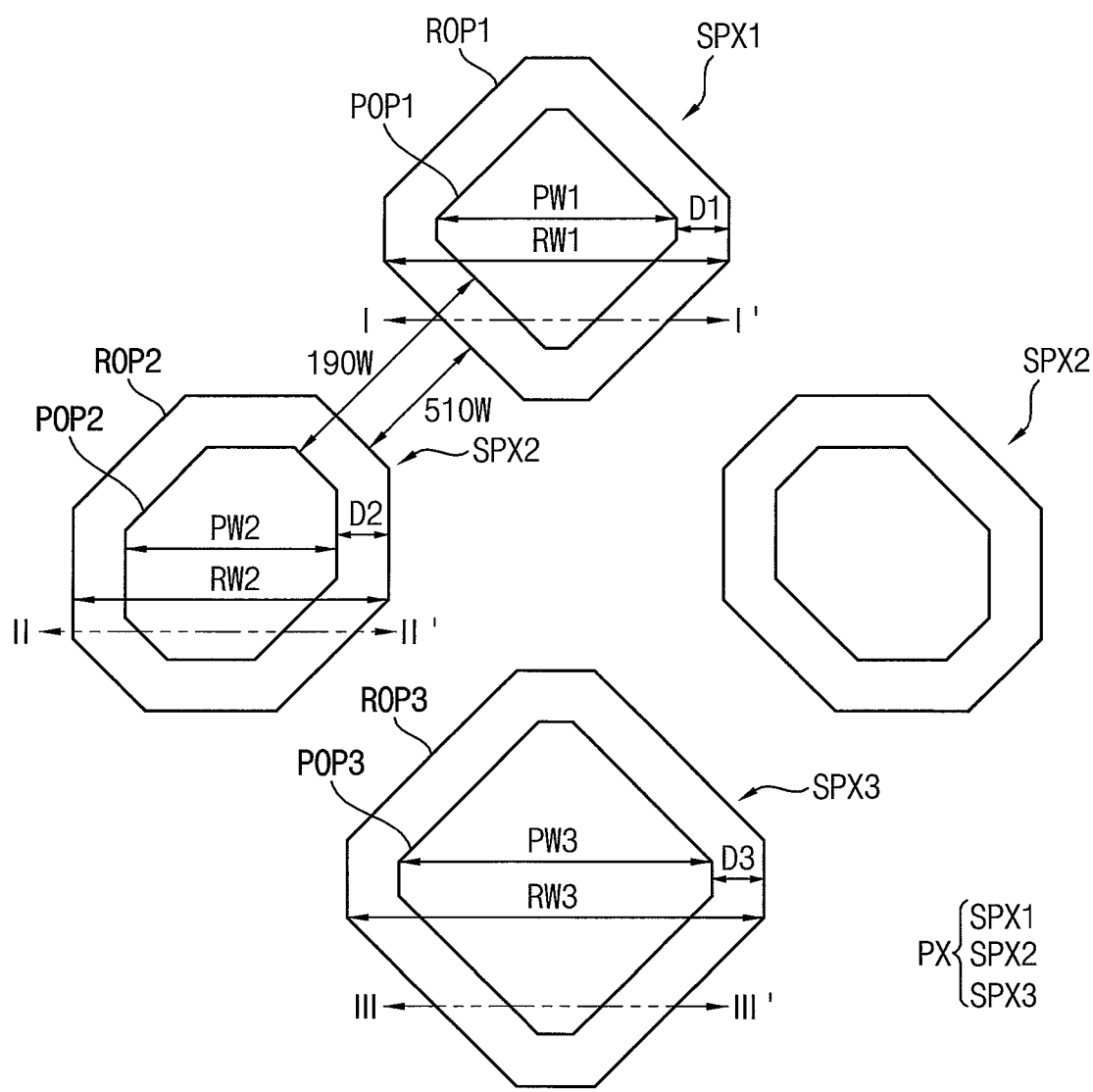
FIG. 2 is a plan view illustrating a pixel included in the display device of FIG. 1.

FIG. 2 is a plan view illustrating the pixel PX included in the display device of FIG. 1.

Referring to FIG. 2, each pixel PX may include a plurality of sub-pixels. The sub-pixels may include a first sub-pixel SPX1, a second sub-pixel SPX2, and a third sub-pixel SPX3. In an embodiment, each pixel PX may include one first sub-pixel SPX1, two second sub-pixels SPX2, and one third sub-pixel SPX3. In this case, the first to third sub-pixels SPX1, SPX2, and SPX3 may be arranged in a pentile matrix form. However, the number of the sub-pixels included in each pixel PX is not limited thereto, for example, in another embodiment, each pixel PX may include one first sub-pixel SPX1, one second sub-pixel SPX2, and one third sub-pixel SPX3. In this case, the first to third sub-pixels SPX1, SPX2, and SPX3 may be arranged in a stripe form.

The first sub-pixel SPX1, the second sub-pixel SPX2, and the third sub-pixel SPX3 may emit light having different colors from each other. In an embodiment, the first sub-pixel SPX1, the second sub-pixel SPX2, and the third sub-pixel SPX3 may be a red sub-pixel for emitting red light, a green sub-pixel for emitting green light, and a blue sub-pixel for emitting blue light, respectively. Each pixel PX may separately control a brightness of the light emitted from each of the first sub-pixel SPX1, the second sub-pixel SPX2, and the third sub-pixel SPX3, thereby emitting light having various colors. Accordingly, the display device may display a color image formed of light having various colors emitted from the plurality of pixels PX.

Figure 3:
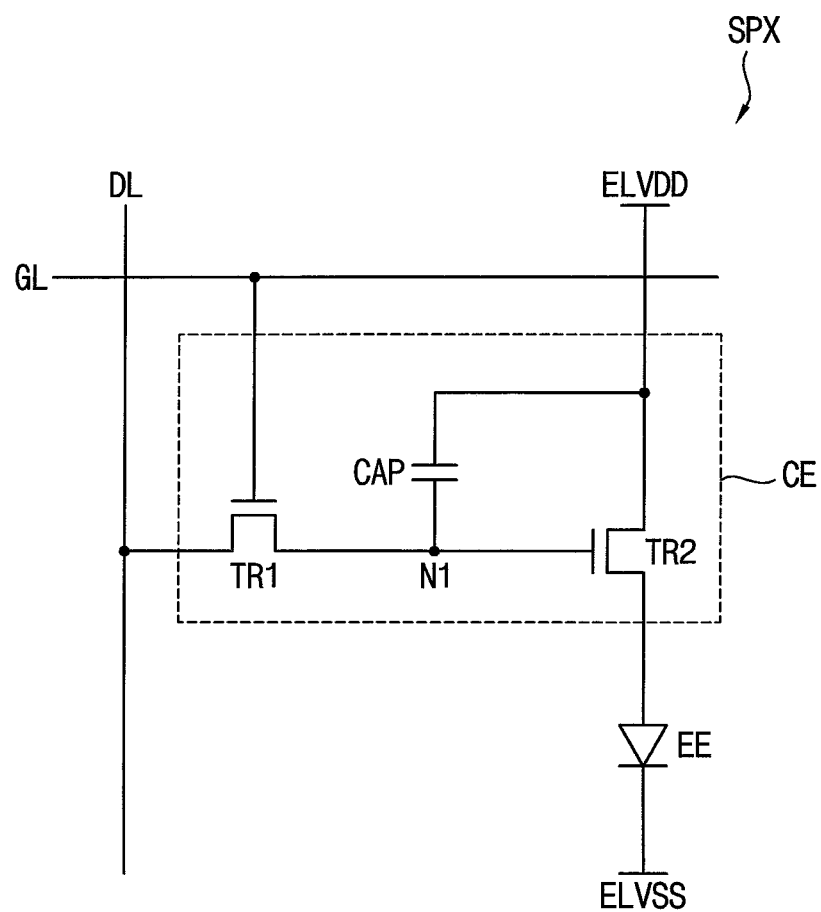
FIG. 3 is a circuit diagram illustrating a sub-pixel included in the pixel of FIG. 2.

FIG. 3 is a circuit diagram illustrating a sub-pixel SPX included in the pixel PX of FIG. 2. The sub-pixel SPX illustrated in FIG. 3 may be a representative example of any one of the first sub-pixel SPX1, the second sub-pixel SPX2, and the third sub-pixel SPX3 of FIG. 2. In other words, each of the first sub-pixel SPX1, the second sub-pixel SPX2, and the third sub-pixel SPX3 of FIG. 2 may have the same or substantially the same structure and/or configuration as that of the sub-pixel SPX shown in FIG. 3, but the present disclosure is not limited thereto.

Referring to FIG. 3, the sub-pixel SPX may be electrically connected to a gate line GL, a data line DL, a first power source ELVDD, and a second power source ELVSS. The gate line GL may extend along the row direction, and the data line DL may extend along the column direction. In an embodiment, a voltage level of the first power source ELVDD may be greater than a voltage level of the second power source ELVSS. The sub-pixel SPX may be disposed at (e.g., in or on) a portion at which the gate line GL and the data line DL cross each other, and may receive a gate signal and a data signal from the gate line GL and the data line DL, respectively. The sub-pixel SPX may emit light according to (e.g., based on) the gate signal and the data signal.

The sub-pixel SPX may include a circuit element CE and a light emitting element EE. The circuit element CE may generate a driving current according to (e.g., based on) the gate signal and the data signal, and may provide the driving current to the light emitting element EE. In an embodiment, the circuit element CE may include a first transistor TR1, a second transistor TR2, and a capacitor CAP. However, the present disclosure is not limited thereto, and in another embodiment, the circuit element CE may include three or more transistors and/or two or more capacitors.

The first transistor TR1 may include a gate electrode connected to the gate line GL, a source electrode connected to the data line DL, and a drain electrode connected to a first node N1. The second transistor TR2 may include a gate electrode connected to the first node N1, a source electrode connected to the first power source ELVDD, and a drain electrode connected to the light emitting element EE. The capacitor CAP may include a first capacitor electrode connected to the first node N1 and a second capacitor electrode connected to the first power source ELVDD.

The light emitting element EE may emit light according to (e.g., based on) the driving current provided from the circuit element CE. The light emitting element EE may include an anode connected to the second transistor TR2 and a cathode connected to the second power source ELVSS.

When the first transistor TR1 is turned on in response to the gate signal transmitted from the gate line GL, the first transistor TR1 may transmit the data signal transmitted from the data line DL to the first node N1. The second transistor TR2 may generate the driving current according to (e.g., based on) a voltage between the first power source ELVDD and the first node N1, which is stored in the capacitor CAP, and the second transistor TR2 may provide the driving current to the light emitting element EE. The light emitting element EE may emit light according to (e.g., based on) the driving current.

Figure 4:
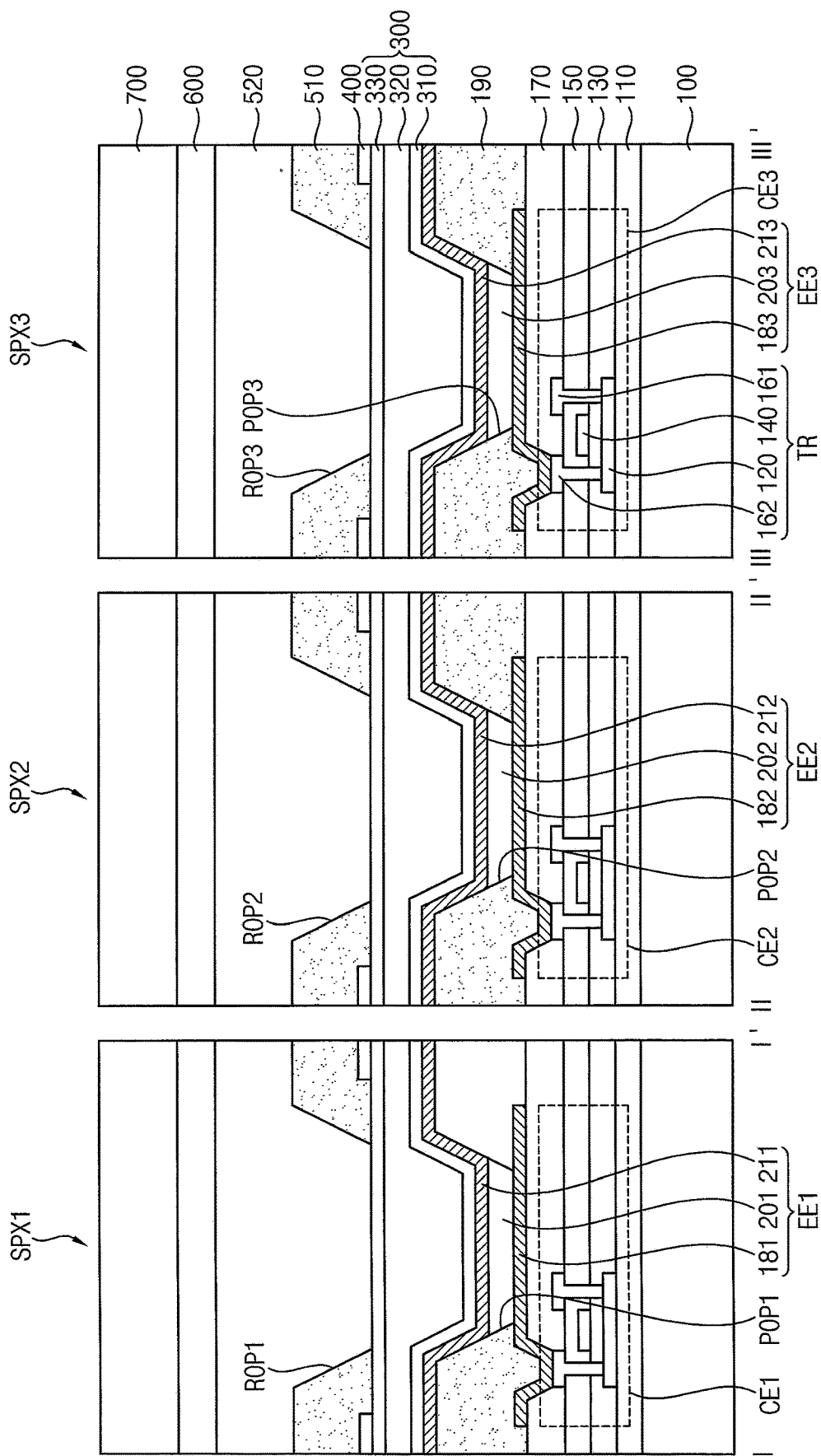
FIG. 4 is cross-sectional views taken along the lines I-I', II-II', and III-III' of FIG. 2.

FIG. 4 is cross-sectional views taken along the lines I-I', II-II', and III-III' of FIG. 2.

Referring to FIGS. 2 and 4, the pixel PX of the display device may include a substrate 100, first to third circuit elements CE1, CE2, and CE3, first to third light emitting elements EE1, EE2, and EE3, a thin film encapsulation layer 300, an input sensing layer 400, a first refractive layer 510, a second refractive layer 520, a polarizing layer 600, and a window 700. The first sub-pixel SPX1 may include the first circuit element CE1 and the first light emitting element EE1 electrically connected to the first circuit element CE1, the second sub-pixel SPX2 may include the second circuit element CE2 and the second light emitting element EE2 electrically connected to the second circuit element CE2, and the third sub-pixel SPX3 may include the third circuit element CE3 and the third light emitting element EE3 electrically connected to the third circuit element CE3. Each of the first circuit element CE1, the second circuit element CE2, and the third circuit element CE3 may include a transistor TR. For example, the transistor TR shown in FIG. 4 may correspond to (e.g., may be) the second transistor TR2 illustrated in FIG. 3. However, as discussed above with reference to FIG. 3, each of the first circuit element CE1, the second circuit element CE2, and the third circuit element CE3 may further include the first transistor TR1 and the capacitor CAP.

The substrate 100 may be an insulating substrate including, for example, glass, quartz, plastic, and/or the like. In an embodiment, the substrate 100 may be a flexible substrate. In this case, the substrate 100 may include, for example, a polymer resin such as polycarbonate (PC), polymethyl methacrylate (PMMA), polyarylate (PAR), polyethersulfone (PES), polyethylene terephthalate (PET), polyethylene naphthalate (PEN), and/or the like.

A buffer layer 110 may be disposed on the substrate 100. The buffer layer 110 may prevent or substantially prevent impurities, for example, such as oxygen, moisture, and/or the like, from being permeated through the substrate 100. Further, the buffer layer 110 may provide a planarized surface on the substrate 100. The buffer layer 110 may include (e.g., may be) an inorganic insulation layer including, for example, silicon nitride, silicon oxide, silicon oxynitride, and/or the like. However, the present disclosure is not limited thereto, and in another embodiment, the buffer layer 110 may be omitted.

A semiconductor layer 120 may be disposed on the buffer layer 110. The semiconductor layer 120 may include (e.g., may be formed of), for example, amorphous silicon, polysilicon, an oxide semiconductor, and/or the like. For example, when the semiconductor layer 120 includes (e.g., is formed of) polysilicon, the semiconductor layer 120 may include a channel region, and a source region and a drain region at opposite sides of the channel region. The channel region may not be doped with impurities, and the source region and the drain region may be doped with impurities. For example, in an embodiment, doping impurities that may generally be used may include (e.g., may be) P-type impurities such as boron (B), $B_2H_6$, and/or the like. However, the present disclosure is not limited thereto, and the doping impurities that may be used may be different (e.g., may be changed) according to a type of the transistor TR. For example, in an embodiment, the transistor TR may be a PMOS transistor, in which case the P-type impurities may be used. However, the transistor TR is not limited thereto, and in other embodiments, the transistor TR may be an NMOS transistor or a CMOS transistor.

A first insulation layer 130 may be disposed on the semiconductor layer 120. The first insulation layer 130 may cover the semiconductor layer 120, and may be disposed on the buffer layer 110. The first insulation layer 130 may include (e.g., may be) an inorganic insulation layer including, for example, silicon nitride, silicon oxide, silicon oxynitride, and/or the like.

A gate electrode 140 may be disposed on the first insulation layer 130. The gate electrode 140 may overlap with the channel region of the semiconductor layer 120. The gate electrode 140 may include (e.g., may be formed of), for example, molybdenum (Mo), chromium (Cr), tungsten (W), and/or the like.

A second insulation layer 150 may be disposed on the gate electrode 140. The second insulation layer 150 may cover the gate electrode 140, and may be disposed on the first insulation layer 130. The second insulation layer 150 may include (e.g., may be) an inorganic insulation layer including, for example, silicon nitride, silicon oxide, silicon oxynitride, and/or the like.

A source electrode 161 and a drain electrode 162 may be disposed on the second insulation layer 150. The source electrode 161 and the drain electrode 162 may contact (e.g., may be in contact with) the source region and the drain region of the semiconductor layer 120, respectively, through contact holes that extend (e.g., that pass) through the first insulation layer 130 and the second insulation layer 150. The source electrode 161 and the drain electrode 162 may include (e.g., may be formed of), for example, aluminum (Al), titanium (Ti), chromium (Cr), tungsten (W), and/or the like. The semiconductor layer 120, the gate electrode 140, the source electrode 161, and the drain electrode 162 may be included in (e.g., may form) the transistor TR.

A planarization layer 170 may be disposed on the source electrode 161 and the drain electrode 162. The planarization layer 170 may cover the source electrode 161 and the drain electrode 162, and may be disposed on the second insulation layer 150. The planarization layer 170 may provide a planarized surface on the source electrode 161 and the drain electrode 162. The planarization layer 170 may include (e.g., may be) an organic insulation layer including, for example, acrylic resin, epoxy-based resin, polyimide-based resin, polyester-based resin, and/or the like, and/or may include (e.g., may be) an inorganic insulation layer including, for example, silicon nitride, silicon oxide, silicon oxynitride, and/or the like.

The first light emitting element EE1, the second light emitting element EE2, and the third light emitting element EE3 may be disposed on the planarization layer 170. The first light emitting element EE1 may include a first pixel electrode 181, a first emission layer 201, and a first opposite electrode 211. The second light emitting element EE2 may include a second pixel electrode 182, a second emission layer 202, and a second opposite electrode 212. The third light emitting element EE3 may include a third pixel electrode 183, a third emission layer 203 and a third opposite electrode 213.

The first pixel electrode 181, the second pixel electrode 182, and the third pixel electrode 183 may be disposed on the planarization layer 170. The first pixel electrode 181, the second pixel electrode 182, and the third pixel electrode 183 may be electrically connected to the first circuit element CE1, the second circuit element CE2, and the third circuit element CE3, respectively, through contact holes formed in the planarization layer 170. The first to third pixel electrodes 181, 182, and 183 may be individually formed at (e.g., in or on) the first to third sub-pixels SPX1, SPX2, and SPX3, respectively. In other words, the first to third pixel electrodes 181, 182, and 183 may be spaced apart from each other (e.g., may be separated from each other).

A pixel defining layer 190 may be disposed on the first pixel electrode 181, the second pixel electrode 182, and the third pixel electrode 183. The pixel defining layer 190 may cover (e.g., may partially cover) the first pixel electrode 181, the second pixel electrode 182, and the third pixel electrode 183, and may be formed on the planarization layer 170. The pixel defining layer 190 may include an organic material, for example, such as polyimide (PI), hexamethyldisiloxane (HMDSO), and/or the like.

The pixel defining layer 190 may have a first pixel opening POP1, a second pixel opening POP2, and a third pixel opening POP3, which expose at least a portion of the first pixel electrode 181, at least a portion of the second pixel electrode 182, and at least a portion of the third pixel electrode 183, respectively. For example, the first pixel opening POP1, the second pixel opening POP2, and the third pixel opening POP3 may expose a center portion (e.g., a central area of a top surface) of the first electrode 181, a center portion (e.g., a central area of a top surface) of the second electrode 182, and a center portion (e.g., a central area of a top surface) of the third electrode 183, respectively. The pixel defining layer 190 may cover a peripheral portion of the first electrode 181, a peripheral portion of the second electrode 182, and a peripheral portion of the third electrode 183. The pixel defining layer 190 may define the first to third sub-pixels SPX1, SPX2, and SPX3 by having the first pixel opening POP1, the second pixel opening POP2, and the third pixel opening POP3.

A size (e.g., a width or an area in a plan view) of the first pixel opening POP1, a size (e.g., a width or an area in a plan view) of the second pixel opening POP2, and a size (e.g., a width or an area in a plan view) of the third pixel opening POP3 may be different from each other. In an embodiment, the size of the second pixel opening POP2 may be less than the size of the first pixel opening POP1, and the size of the third pixel opening POP3 may be greater than the size of the first pixel opening POP1.

The first emission layer 201 may be disposed on the first pixel electrode 181 at (e.g., in or on) the first pixel opening POP1, the second emission layer 202 may be disposed on the second pixel electrode 182 at (e.g., in or on) the second pixel opening POP2, and the third emission layer 203 may be disposed on the third pixel electrode 183 at (e.g., in or on) the third pixel opening POP3. Each of the first emission layer 201, the second emission layer 202, and the third emission layer 203 may include at least one of an organic light emitting material and a quantum dot.

In an embodiment, the organic light emitting material may include, for example, a low molecular weight polymer or a high molecular weight polymer. For example, the low molecular weight polymer may include copper phthalocyanine, N,N'-diphenylbenzidine, tris-(8-hydroxyquinoline)aluminum, and/or the like, and the high molecular weight polymer may include poly(3,4-ethylenedioxythiophene), polyaniline, poly-phenylenevinylene, polyfluorene, and/or the like.

In an embodiment, the quantum dot may include a core that includes, for example, a group II-VI compound, a group III-V compound, a group IV-VI compound, a group IV element, a group IV compound, and/or a combination thereof. In an embodiment, the quantum dot may have a core-shell structure that includes the core and a shell surrounding (e.g., around a periphery of) the core. The shell may serve as a protective layer for preventing or reducing chemical degeneration of the core to maintain or substantially maintain a semiconductor property of the core, and a charging layer for imparting an electrophoretic property to the quantum dot.

The first emission layer 201, the second emission layer 202, and the third emission layer 203 may emit light having different colors from each other. In an embodiment, the first emission layer 201, the second emission layer 202, and the third emission layer 203 may emit red colored light, green colored light, and blue colored light, respectively.

The first opposite electrode 211, the second opposite electrode 212, and the third opposite electrode 213 may be disposed on the first emission layer 201, the second emission layer 202, and the third emission layer 203, respectively. The first to third opposite electrodes 211, 212, and 213 may be commonly formed at (e.g., in or on) the first to third sub-pixels SPX1, SPX2, and SPX3. In other words, the first to third opposite electrodes 211, 212, and 213 may be connected to each other.

Light generated from the first emission layer 201 may be emitted in a direction from the first pixel electrode 181 towards the first opposite electrode 211. Light generated from the second emission layer 202 may be emitted in a direction from the second pixel electrode 182 towards the second opposite electrode 212. Light generated from the third emission layer 203 may be emitted in a direction from the third pixel electrode 183 towards the third opposite electrode 213. In this case, each of the first pixel electrode 181, the second pixel electrode 182, and the third pixel electrode 183 may be formed as a reflective layer, and each of the first opposite electrode 211, the second opposite electrode 212, and the third opposite electrode 213 may be formed as a semi-transmitting layer or a transmitting layer. The reflective layer and the semi-transmitting layer may include a metal, for example, such as magnesium (Mg), silver (Ag), gold (Au), calcium (Ca), lithium (Li), chromium (Cr), aluminum (Al), and/or an alloy thereof. The reflective layer and the semi-transmitting layer may be divided according to (e.g., depending on) a thickness thereof, and in some embodiments, the semi-transmitting layer may have a thickness that is less than about 200 nm. The transmitting layer may include indium tin oxide (ITO), indium zinc oxide (IZO), zinc oxide (ZnO), indium oxide ($In_2O_3$), and/or the like.

The pixel defining layer 190 may cover a peripheral portion of each of the first to third pixel electrodes 181, 182, and 183, and the first to third emission layers 201, 202, and 203 may be disposed at (e.g., in or on) the first to third pixel openings POP1, POP2, and POP3, respectively. The first to third opposite electrodes 211, 212, and 213 may be disposed on the first to third emission layer 201, 202, and 203 at (e.g., in or on) the first to third openings POP1, POP2, and POP3, respectively. Accordingly, the pixel defining layer 190 may surround (e.g., around peripheries of) the first to third light emitting elements EE1, EE2, and EE3. In an embodiment, the pixel defining layer 190 may have a grid shape in a plan view surrounding (e.g., around peripheries of) the first to third sub-pixels SPX1, SPX2, and SPX3.

The thin film encapsulation layer 300 may be disposed on the first opposite electrode 211, the second opposite electrode 212, and the third opposite electrode 213. The thin film encapsulation layer 300 may cover the first to third light emitting elements EE1, EE2, and EE3 to protect the first to third light emitting elements EE1, EE2, and EE3 from external impurities, for example, such as moisture, oxygen, and/or the like. The thin film encapsulation layer 300 may include at least one inorganic encapsulation layer and at least one organic encapsulation layer. In an embodiment, the thin film encapsulation layer 300 may include a first inorganic encapsulation layer 310, an organic encapsulation layer 320, and a second inorganic encapsulation layer 330.

The first inorganic encapsulation layer 310 may be disposed on the first opposite electrode 211, the second opposite electrode 212, and the third opposite electrode 213. The first inorganic encapsulation layer 310 may include, for example, aluminum oxide ($Al_2O_3$), silicon nitride ($SiN_x$), silicon oxide ($SiO_2$), and/or the like. The first inorganic encapsulation layer 310 may be formed along a profile (e.g., of a top surface) of the first to third opposite electrodes 211, 212, and 213.

The organic encapsulation layer 320 may be disposed on the first inorganic encapsulation layer 310. The organic encapsulation layer 320 may include, for example, epoxy, acrylate, urethane acrylate, and/or the like. The organic encapsulation layer 320 may have a planarized upper surface, and thus, the organic encapsulation layer 320 may planarize (e.g., may planarize above) the first to third light emitting elements EE1, EE2, and EE3.

The second inorganic encapsulation layer 330 may be disposed on the organic encapsulation layer 320. The second inorganic encapsulation layer 330 may be formed on the first inorganic encapsulation layer 310, and may cover the organic encapsulation layer 320. For example, an edge of the second inorganic encapsulation layer 330 may be in contact with an edge of the first inorganic encapsulation layer 310 (e.g., around a periphery of the display device). Because the second inorganic encapsulation layer 330 is formed on the organic encapsulation layer 320 having the planarized upper surface, the second inorganic encapsulation layer 330 may provide a planarized surface thereon. The second inorganic encapsulation layer 330 may include, for example, aluminum oxide ($Al_2O_3$), silicon nitride ($SiN_x$), silicon oxide ($SiO_2$), and/or the like. In an embodiment, the second inorganic encapsulation layer 330 may include a material that is the same or substantially the same as that of the first inorganic encapsulation layer 310.

The input sensing layer 400 may be disposed on the thin film encapsulation layer 300. The input sensing layer 400 may sense an external input, for example, such as an external object contacting or approaching the input sensing layer 400. For example, the input sensing layer 400 may sense the external input in a capacitive manner.

The input sensing layer 400 may include a low resistance metal, for example, such as silver (Ag), aluminum (Al), copper (Cu), chromium (Cr), nickel (Ni), and/or the like, or may include a conductive nano material, for example, such as silver nanowire, carbon nanotube, and/or the like. The input sensing layer 400 may overlap with the pixel defining layer 190, and may not overlap with the first to third emission layers 201, 202, and 203. Accordingly, light emitted from the first to third emission layers 201, 202, and 203 may not be affected or substantially affected by the input sensing layer 400.

In an embodiment, the input sensing layer 400 may include a sensing electrode for outputting a sensing signal corresponding to an external input to a sensing driver, and a driving electrode for receiving a driving signal from the sensing driver. For example, a first portion of the input sensing layer 400 may include (e.g., may be) the sensing electrode, and a second portion of the input sensing layer 400 may include (e.g., may be) the driving electrode.

The first refractive layer 510 may be disposed on the input sensing layer 400.

The first refractive layer 510 may be formed on the thin film encapsulation layer 300, and may cover the input sensing layer 400. The first refractive layer 510 may have a first refractive index that may be a relatively low refractive index.

The first refractive layer 510 may include a first refractive opening ROP1, a second refractive opening ROP2, and a third refractive opening ROP3. The first refractive opening ROP1, the second refractive opening ROP2, and the third refractive opening ROP3 may overlap with the first pixel opening POP1, the second pixel opening POP2, and the third pixel opening POP3, respectively. In this case, the first refractive layer 510 may overlap with the pixel defining layer 190. For example, the first refractive layer 510 may have a grid shape in a plan view overlapping with the pixel defining layer 190. The first to third refractive openings ROP1, ROP2, and ROP3 may expose an upper surface of the thin film encapsulation layer 300.

In an embodiment, the first refractive opening ROP1 may have a shape (e.g., a planar shape) that is the same or substantially the same as that of the first pixel opening POP1 in a plan view, the second refractive opening ROP2 may have a shape (e.g., a planar shape) that is the same or substantially the same as that of the second pixel opening POP2 in a plan view, and the third refractive opening ROP3 may have a shape (e.g., a planar shape) that is the same or substantially the same as that of the third pixel opening POP3 in a plan view.

In an embodiment, a size (e.g., a width or an area in a plan view) of the first refractive opening ROP1, a size (e.g., a width or an area in a plan view) of the second refractive opening ROP2, and a size (e.g., a width or an area in a plan view) of the third refractive opening ROP3 may be greater than the size of the first pixel opening POP1, the size of the second pixel opening POP2, and the size of the third pixel opening POP3, respectively. In this case, an edge of the first refractive opening ROP1, an edge of the second refractive opening ROP2, and an edge of the third refractive opening ROP3 may surround (e.g., around peripheries of) an edge of the first pixel opening POP1, an edge of the second pixel opening POP2, and an edge of the third pixel opening POP3, respectively. In another embodiment, the size of the first refractive opening ROP1, the size of the second refractive opening ROP2, and the size of the third refractive opening ROP3 may be less than the size of the first pixel opening POP1, the size of the second pixel opening POP2, and the size of the third pixel opening POP3, respectively. In this case, the edge of the first pixel opening POP1, the edge of the second pixel opening POP2, and the edge of the third pixel opening POP3 may surround (e.g., in a plan view) the edge of the first refractive opening ROP1, the edge of the second refractive opening ROP2, and the edge of the third refractive opening ROP3, respectively. In still another embodiment, the size of the first refractive opening ROP1, the size of the second refractive opening ROP2, and the size of the third refractive opening ROP3 may be equal to or substantially equal to the size of the first pixel opening POP1, the size of the second pixel opening POP2, and the size of the third pixel opening POP3, respectively.

In an embodiment, the first refractive layer 510 may include a photoresist. The first refractive layer 510 including the first to third refractive openings ROP1, ROP2, and ROP3 may be formed by coating the photoresist on the thin film encapsulation layer 300 on which the input sensing layer 400 is formed, patterning the photoresist by exposing and developing the photoresist, and light-curing the photoresist. By light-curing the photoresist, a chemical resistance of the first refractive layer 510 may increase, and the amount of outgas generated from the first refractive layer 510 may decrease.

The second refractive layer 520 may be disposed on the first refractive layer 510. The second refractive layer 520 may be formed on the thin film encapsulation layer 300, and may cover the first refractive layer 510. The second refractive layer 520 may have a second refractive index that may be a relatively high refractive index.

The second refractive layer 520 may fill the first to third refractive openings ROP1, ROP2, and ROP3 of the first refractive layer 510. In this case, the second refractive layer 520 may overlap with the first to third light emitting elements EE1, EE2, and EE3 and the pixel defining layer 190. An upper surface of the second refractive layer 520 may be planarized or substantially planarized. Accordingly, the second refractive layer 520 may provide a planarized surface to the polarizing layer 600 disposed on the second refractive layer 520.

The second refractive index of the second refractive layer 520 may be greater than the first refractive index of the first refractive layer 510. Accordingly, light may be refracted at an interface between the first refractive layer 510 and the second refractive layer 520. Because the second refractive index is greater than the first refractive index, light incident onto the second refractive layer 520 and traveling in a side direction of the display device may be refracted or reflected at an interface between the first refractive layer 510 and the second refractive layer 520, and may be emitted in a front direction of the display device. Accordingly, a front light efficiency of the display device may increase.

In an embodiment, the first refractive layer 510 may include a material having a relatively low refractive index, for example, such as acrylic resin. Further, the second refractive layer 520 may include, for example, siloxane and at least one from among zirconium oxide ($ZrO_x$), aluminum oxide ($AlO_x$), and titanium oxide ($TiO_x$), such that the second refractive layer 520 has a relatively high refractive index.

The polarizing layer 600 may be disposed on the second refractive layer 520. The polarizing layer 600 may reduce reflection of external light of the display device. For example, when external light (e.g., incoming external light) passes through the polarizing layer 600 and is reflected (e.g., reflected external light) from below the polarizing layer 600 (e.g., from the first to third opposite electrodes 211, 212, and 213) such that the external light again passes through the polarizing layer 600, a phase of the reflected external light may be changed as the incoming external light passed through the polarizing layer 600 twice. As a result, a phase of the reflected external light may be different from the phase of the incoming external light entering the polarizing layer 600 to the extent that a destructive interference occurs. Accordingly, the reflection of external light may be reduced to increase visibility of the display device.

The window 700 may be disposed on the polarizing layer 600. The window 700 may protect the elements of the display device from an external impact, and may provide a display surface of the display device. In an embodiment, the window 700 may include glass, polymer resin, and/or the like. The polymer resin may include, for example, polycarbonate (PC), polymethyl methacrylate (PMMA), polyarylate (PAR), polyethersulfone (PES), polyethylene terephthalate (PET), polyethylene naphthalate (PEN), and/or the like.

Hereinafter, a minimum gap D between the pixel opening POP and the refractive opening ROP in a plan view will be described with reference to FIGS. 2 and 5 to 9, according to one or more embodiments of the present disclosure.

Figure 5:
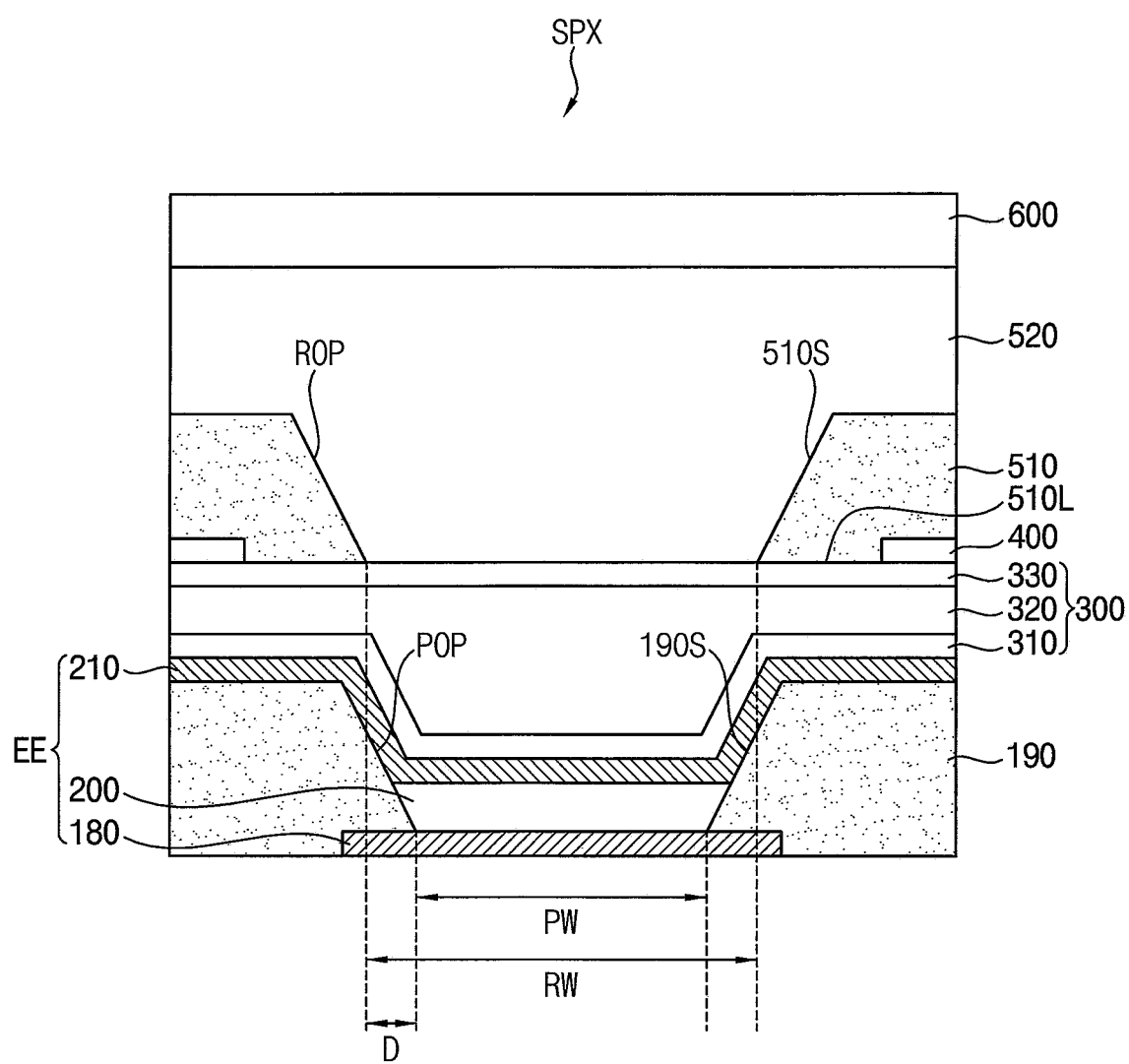
FIG. 5 is a cross-sectional view illustrating a sub-pixel according to an embodiment.
Figure 6:
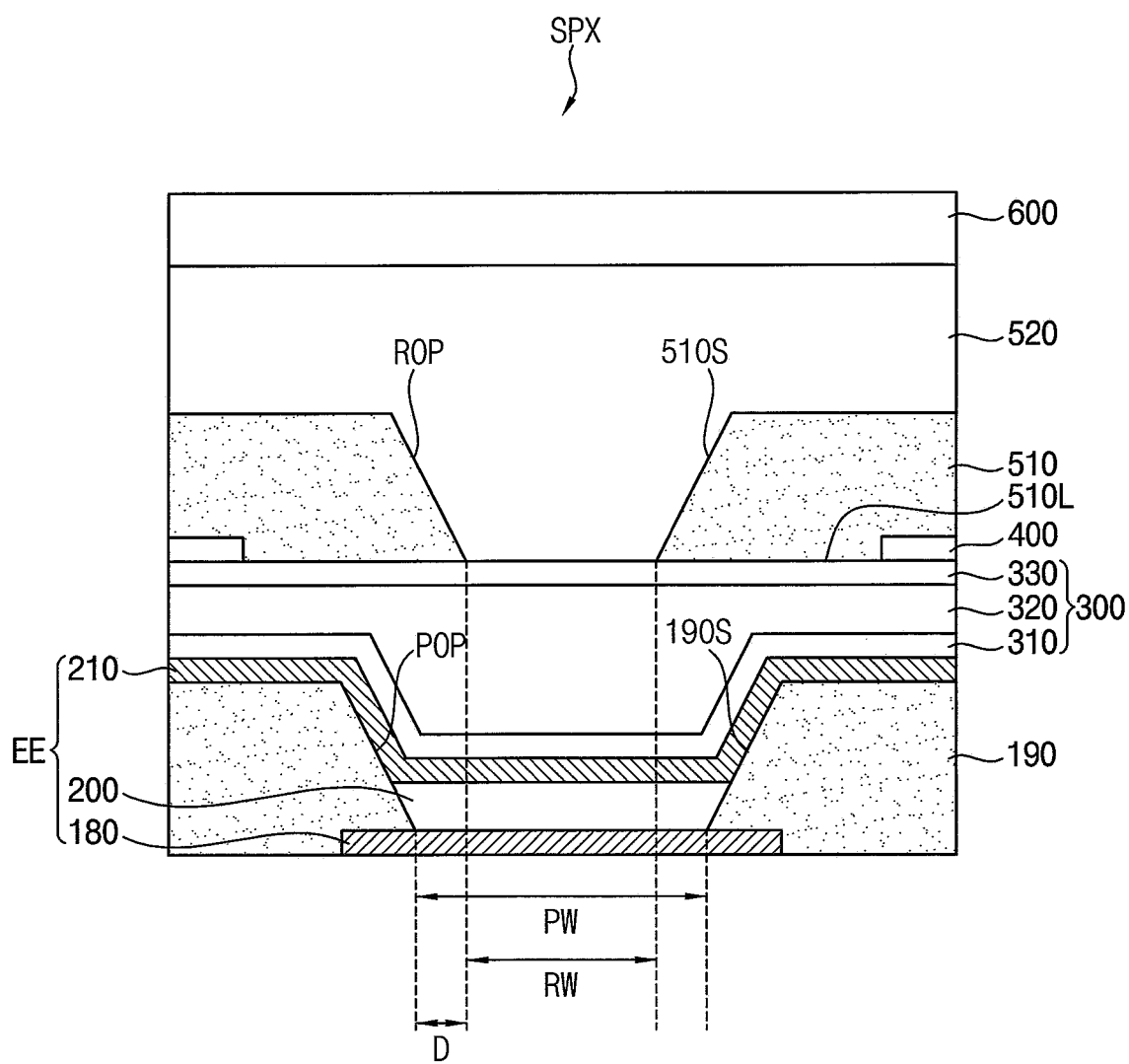
FIG. 6 is a cross-sectional view illustrating a sub-pixel according to another embodiment.

FIG. 5 is a cross-sectional view illustrating a sub-pixel SPX according to an embodiment. FIG. 6 is a cross-sectional view illustrating a sub-pixel SPX according to another embodiment. The sub-pixel SPX illustrated in each of FIGS. 5 and 6 may be a representative example of any one of the first sub-pixel SPX1, the second sub-pixel SPX2, and the third sub-pixel SPX3 of FIG. 4. In other words, any of (or each of) the first sub-pixel SPX1, the second sub-pixel SPX2, and the third sub-pixel SPX3 of FIG. 4 may have the same or substantially the same structure and/or configuration as that of the sub-pixel SPX shown in FIG. 5 or that of the sub-pixel SPX shown in FIG. 6, but the present disclosure is not limited thereto. Therefore, a light emitting element EE illustrated in FIGS. 5 and 6 may be any one of the first light emitting element EE1, the second light emitting element EE2, and the third light emitting element EE3 of FIG. 4. Similarly, a pixel opening POP illustrated in FIGS. 5 and 6 may be any one of the first pixel opening POP1, the second pixel opening POP2, and the third pixel opening POP3 of FIG. 4, and a refractive opening ROP illustrated in FIGS. 5 and 6 may be any one of the first refractive opening ROP1, the second refractive opening ROP2, and the third refractive opening ROP3 of FIG. 4.

Referring to FIGS. 5 and 6, an edge of the pixel opening POP and an edge of the refractive opening ROP may be spaced apart from each other by a gap (e.g., a predetermined gap or a predetermined distance) in a plan view. Here, the edge of the pixel opening POP may refer to a portion thereof at which a sidewall 190S of the pixel defining layer 190 at (e.g., defined by) the pixel opening POP contacts the pixel electrode 180, and the edge of the refractive opening ROP may refer to a portion thereof at which a sidewall 510S of the first refractive layer 510 at (e.g., defined by) the refractive opening ROP contacts the thin film encapsulation layer 300. A gap from the edge of the pixel opening POP to the edge of the refractive opening ROP adjacent thereto in a plan view may be defined as a minimum gap (e.g., a gap or a distance) D between the pixel opening POP and the refractive opening ROP in the plan view. Further, the edge of the pixel opening POP and the edge of the refractive opening ROP may refer to an edge of the pixel defining layer 190 and an edge of the first refractive layer 510, respectively. Accordingly, the minimum gap D may also be defined as a gap (e.g., a distance) from the edge of the pixel defining layer 190 to the edge of the first refractive layer 510 adjacent thereto in a plan view.

The minimum gap D between the pixel opening POP and the refractive opening ROP in a plan view (e.g., the minimum gap D between the edge of the pixel defining layer 190 and the edge of the first refractive layer 510 in the plan view) may be greater than or equal to about −1 μm and less than or equal to about 2.5 μm. Here, when the minimum gap D is negative (e.g., a negative value), a width RW of the refractive opening ROP is less than a width PW of the pixel opening POP, and when the minimum gap D is positive (e.g., a positive value), the width RW of the refractive opening ROP is greater than the width PW of the pixel opening POP. In other words, the minimum gap D may be positive (e.g., may be a positive value) when the width RW of the refractive opening ROP is greater than the width PW of the pixel opening POP as illustrated in FIG. 5, and the minimum gap D may be negative (e.g., may be a negative value) when the width RW of the refractive opening ROP is less than the width PW of the pixel opening POP as illustrated in FIG. 6. The edge of the refractive opening ROP may be located inside the edge of the pixel opening POP (e.g., the pixel opening POP surrounds (e.g., around a periphery of) the refractive opening ROP) in a plan view when the minimum gap D is negative, and the edge of the refractive opening ROP may be located outside the edge of the pixel opening POP (e.g., the refractive opening ROP surrounds (e.g., around a periphery of) the pixel opening POP) in a plan view when the minimum gap D is positive. Further, the negative minimum gap D may refer to a case where a width of the first refractive layer 510 (e.g., between adjacent ones of the refractive openings ROP) is greater than a width of the pixel defining layer 190 (e.g., between adjacent ones of the pixel openings POP), and the positive minimum gap D may refer to a case where the width of the first refractive layer 510 is less than the width of the pixel defining layer 190. For example, the minimum gap D may be positive when the width 510W of the first refractive layer 510 is less than the width 190W of the pixel defining layer 190 as illustrated in FIG. 2.

When the minimum gap D between the pixel opening POP and the refractive opening ROP in a plan view is less than about −1 μm, an effect of the first refractive layer 510 on light emitted towards the front from the emission layer 200 may increase, thereby decreasing a front light efficiency. In other words, when the minimum gap D is less than about −1 μm, the amount of front light refracted and/or reflected by a lower surface 510L of the first refractive layer 510 may increase, and thus, the front light efficiency may decrease. Further, when the minimum gap D between the pixel opening POP and the refractive opening ROP in a plan view is greater than about 2.5 μm, an effect of the first refractive layer 510 on light emitted towards the side from the emission layer 200 may decrease, thereby decreasing the front light efficiency. In other words, when the minimum gap D is greater than about 2.5 μm, the amount of side light refracted and/or reflected by the sidewall 510S of the first refractive layer 510 and proceeding towards a front direction may decrease, and thus, the front light efficiency may decrease.

A value obtained by subtracting the width PW of the pixel opening POP from the width RW of the refractive opening ROP (e.g., a value obtained by subtracting a width of the first refractive layer 510 from a width of the pixel defining layer 190) may be greater than or equal to about −2 μm and less than or equal to about 5 μm. When the width RW of the refractive opening ROP is greater than the width PW of the pixel opening POP as illustrated in FIG. 5, the width RW of the refractive opening ROP may correspond to (e.g., may be equal to or substantially equal to) a value obtained by adding twice the minimum distance D between the pixel opening POP and the refractive opening ROP in a plan view to the width PW of the pixel opening POP. In this case, a value obtained by subtracting the width PW of the pixel opening POP from the width RW of the refractive opening ROP may be less than or equal to about 5 μm. When the width RW of the refractive opening ROP is less than the width PW of the pixel opening POP as illustrated in FIG. 6, the width PW of the pixel opening POP may correspond to (e.g., may be equal to or substantially equal to) a value obtained by adding twice the minimum distance D between the pixel opening POP and the refractive opening ROP in a plan view to the width RW of the refractive opening ROP. In this case, a value obtained by subtracting the width PW of the pixel opening POP from the width RW of the refractive opening ROP may be greater than or equal to about −2 μm.

Referring again to FIG. 2, each of a first minimum gap D1 between the first pixel opening POP1 and the first refractive opening ROP1 in a plan view, a second minimum gap D2 between the second pixel opening POP2 and the second refractive opening ROP2 in a plan view, and a third minimum gap D3 between the third pixel opening POP3 and the third refractive opening ROP3 in a plan view may be greater than or equal to about −1 μm and less than or equal to about 2.5 μm. Here, when the first to third minimum gaps D1, D2, and D3 are negative, the widths RW1, RW2, and RW3 of the first to third refractive openings ROP1, ROP2, and ROP3 may be less than widths PW1, PW2, and PW3 of the first to third pixel openings POP1, POP2, and POP3, respectively. When the first to third minimum gaps D1, D2, and D3 are positive, the widths RW1, RW2, and RW3 of the first to third refractive openings ROP1, ROP2, and ROP3 may be greater than the widths PW1, PW2, and PW3 of the first to third pixel openings POP1, POP2, and POP3, respectively.

Each of a value obtained by subtracting the width PW1 of the first pixel opening POP1 from the width RW1 of the first refractive opening ROP1, a value obtained by subtracting the width PW2 of the second pixel opening POP2 from the width RW2 of the second refractive opening ROP2, and a value obtained by subtracting the width PW3 of the third pixel opening POP3 from the width RW3 of the third refractive opening ROP3 may be greater than or equal to about −2 μm and less than or equal to about 5 μm. As illustrated in FIG. 2, when the widths RW1, RW2, and RW3 of the first to third refractive openings ROP1, ROP2, and ROP3 are greater than widths PW1, PW2, and PW3 of the first to third pixel openings POP1, POP2, and POP3, respectively, the width RW1 of the first refractive opening ROP1 may correspond to (e.g., may be or may have) a value obtained by adding twice the first minimum distance D1 between the first pixel opening POP1 and the first refractive opening ROP1 in a plan view to the width PW1 of the first pixel opening POP1, the width RW2 of the second refractive opening ROP2 may correspond to (e.g., may be or may have) a value obtained by adding twice the second minimum distance D2 between the second pixel opening POP2 and the second refractive opening ROP2 in a plan view to the width PW2 of the second pixel opening POP2, and the width RW3 of the third refractive opening ROP3 may correspond to (e.g., may be or may have) a value obtained by adding twice the third minimum distance D3 between the third pixel opening POP3 and the third refractive opening ROP3 in a plan view to the width PW3 of the third pixel opening POP3. In this case, each of a value obtained by subtracting the width PW1 of the first pixel opening POP1 from the width RW1 of the first refractive opening ROP1, a value obtained by subtracting the width PW2 of the second pixel opening POP2 from the width RW2 of the second refractive opening ROP2, and a value obtained by subtracting the width PW3 of the third pixel opening POP3 from the width RW3 of the third refractive opening ROP3 may be less than or equal to about 5 μm.

Figure 7:
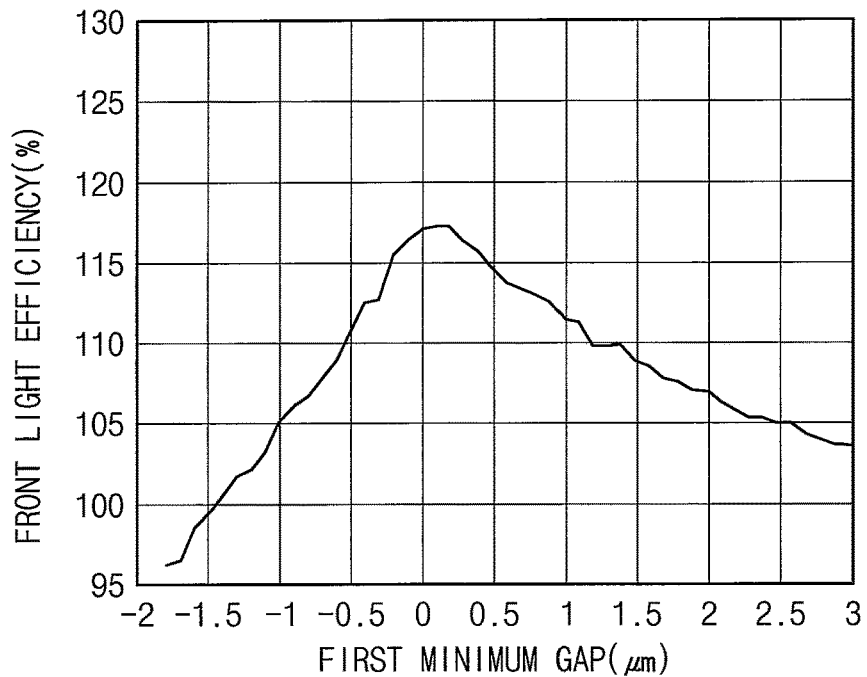
FIG. 7 is a graph illustrating a front light efficiency according to a first minimum gap in a first sub-pixel.
Figure 8:
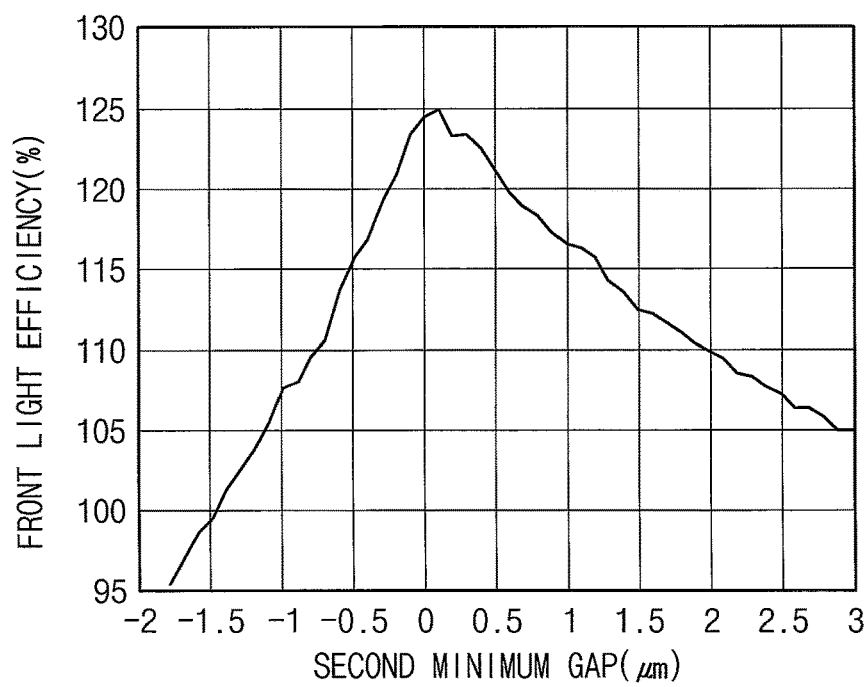
FIG. 8 is a graph illustrating a front light efficiency according to a second minimum gap in a second sub-pixel.
Figure 9:
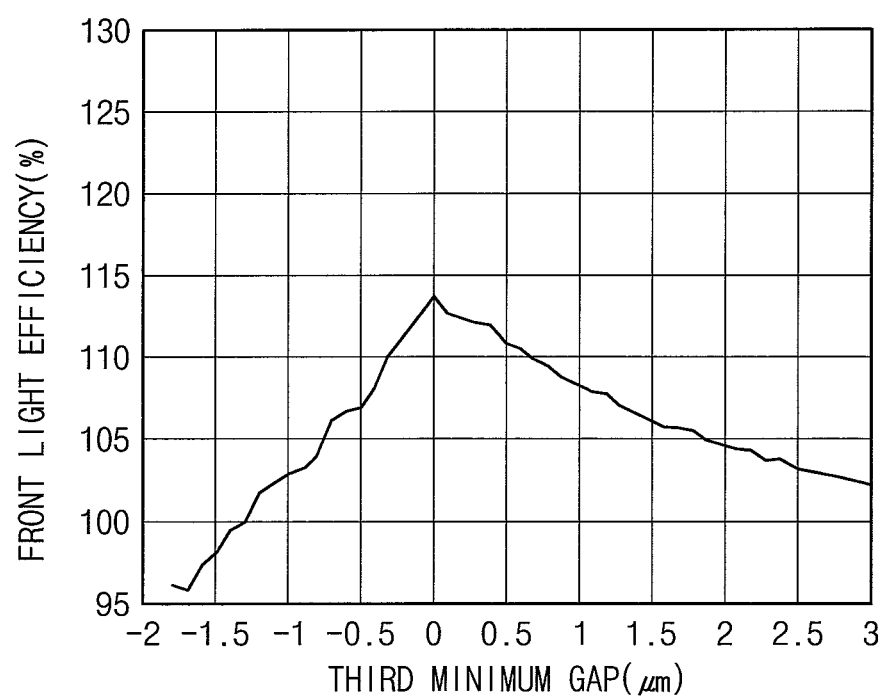
FIG. 9 is a graph illustrating a front light efficiency according to a third minimum gap in a third sub-pixel.

FIG. 7 is a graph illustrating a front light efficiency according to the first minimum gap D1 in the first sub-pixel SPX1. FIG. 8 is a graph illustrating a front light efficiency according to the second minimum gap D2 in the second sub-pixel SPX2. FIG. 9 is a graph illustrating a front light efficiency according to the third minimum gap D3 in the third sub-pixel SPX3. In FIGS. 7 to 9, a horizontal axis of the graph illustrates the distance (e.g., the size) of the minimum gap D1, D2, and D3 between the pixel opening POP1, POP2, and POP3 and the refractive opening ROP1, ROP2, and ROP3 corresponding thereto in a plan view illustrated in FIG. 2, and a vertical axis of the graph illustrates a ratio between a front light efficiency when the first refractive layer 510 is present to a front light efficiency when the first refractive layer 510 is not present.

Referring to FIG. 7, as the first minimum gap D1 increases, the front light efficiency in the first sub-pixel SPX1 may be changed. The graph may be drastically bent when the first minimum gap D1 is about −1 μm, the front light efficiency may have a maximum value when the first minimum gap D1 is about 0 μm, and the graph may be drastically bent when the first minimum gap D1 is about 2.5 μm. Therefore, a desired or an optimal first minimum gap D1 may be greater than or equal to about −1 μm and less than or equal to about 2.5 μm. When the first minimum gap D1 is less than about −1 μm or greater than about 2.5 μm, the front light efficiency in the first sub-pixel SPX1 may drastically deteriorate. Further, the front light efficiency may be greater than or equal to about 105% when the first minimum gap D1 is greater than or equal to about −1 μm and less than or equal to about 2.5 μm.

Referring to FIG. 8, as the second minimum gap D2 increases, the front light efficiency in the second sub-pixel SPX2 may be changed. The graph may be drastically bent when the second minimum gap D2 is about −1 μm, the front light efficiency may have a maximum value when the second minimum gap D2 is about 0 μm, and the graph may be drastically bent when the second minimum gap D2 is about 2.5 μm. Therefore, a desired or an optimal second minimum gap D2 may be greater than or equal to about −1 μm and less than or equal to about 2.5 μm. When the second minimum gap D2 is less than about −1 μm or greater than about 2.5 μm, the front light efficiency in the second sub-pixel SPX2 may drastically deteriorate. Further, the front light efficiency may be greater than or equal to about 107% when the second minimum gap D2 is greater than or equal to about −1 μm and less than or equal to about 2.5 μm.

Referring to FIG. 9, as the third minimum gap D3 increases, the front light efficiency in the third sub-pixel SPX3 may be changed. The graph may be drastically bent when the third minimum gap D3 is about −1 μm, the front light efficiency may have a maximum value when the third minimum gap D3 is about 0 μm, and the graph may be drastically bent when the third minimum gap D3 is about 2.5 μm. Therefore, a desired or an optimal third minimum gap D3 may be greater than or equal to about −1 μm and less than or equal to about 2.5 μm. When the third minimum gap D3 is less than about −1 μm or greater than about 2.5 μm, the front light efficiency in the third sub-pixel SPX3 may drastically deteriorate. Further, the front light efficiency may be greater than or equal to about 103% when the third minimum gap D3 is greater than or equal to about −1 μm and less than or equal to about 2.5 μm.

As illustrated in FIGS. 7 to 9, when each of the first to third minimum gaps D1, D2, and D3 in the first to third sub-pixels SPX1, SPX2, and SPX3 is about −1 μm or about 2.5 μm, the front light efficiency may be drastically changed. Therefore, compared to the case where each of the first to third minimum gaps D1, D2, and D3 is less than about −1 μm or greater than about 2.5 μm, the front light efficiency of the display device may drastically increase when each of the first to third minimum gaps D1, D2, and D3 is greater than or equal to about −1 μm and less than or equal to about 2.5 μm.

Hereinafter, a difference between the first minimum gap D1, the second minimum gap D2, and the third minimum gap D3 will be described with reference to FIGS. 2, 10, and 11.

Referring to FIG. 2, at least one of the first minimum gap D1 between the first pixel opening POP1 and the first refractive opening ROP1 in a plan view, the second minimum gap D2 between the second pixel opening POP2 and the second refractive opening ROP2 in a plan view, and the third minimum gap D3 between the third pixel opening POP3 and the third refractive opening ROP3 in a plan view may be different from the others. In other words, at least two from among the first minimum gap D1, the second minimum gap D2, and the third minimum gap D3 may be different from each other.

In general, a wavelength of white light (e.g., a color of white light) may be changed as a viewing angle increases. This phenomenon is referred to as a white angular dependency (WAD). Here, the viewing angle is defined as an angle between a normal line of a display surface of the display device and a line of sight of a user. As illustrated in FIGS. 5 and 6, the first refractive layer 510 may affect the front light and the side light emitted from the emission layer 200 when the first refractive layer 510 is disposed on the emission layer 200, and thus, the first refractive layer 510 may affect the white angular dependency. In more detail, when the first to third refractive openings ROP1, ROP2, and ROP3 of the refractive layer 510 are formed in the first to third sub-pixels SPX1, SPX2, and SPX3, respectively, the influence of the first to third refractive openings ROP1, ROP2, and ROP3 of the first refractive layer 510 may be different for each of the sub-pixels SPX1, SPX2, and SPX3. For example, compared to the case where the first refractive layer 510 is omitted (e.g., is not formed), the white angular dependency may increase when the first refractive layer 510 is formed in which the first minimum gap D1, the second minimum gap D2, and the third minimum gap D3 are equal to each other. In other words, a white angular dependency when the first refractive layer 510 is formed, in which the first minimum gap D1, the second minimum gap D2, and the third minimum gap D3 are equal are equal to each other, is greater than a white angular dependency when the first refractive layer 510 is not formed. To prevent or substantially prevent the increase of the white angular dependency, at least one of the first minimum gap D1, the second minimum gap D2, and the third minimum gap D3 may be different from the others.

In an embodiment, when comparing the first minimum gap D1 and the second minimum gap D2 with each other, the second minimum gap D2 may be less than the first minimum gap D1. In an embodiment, when comparing the second minimum gap D2 and the third minimum gap D3 with each other, the third minimum gap D3 may be less than the second minimum gap D2. In an embodiment, when comparing the third minimum gap D3 and the first minimum gap D1 with each other, the third minimum gap D3 may be less than or equal to the first minimum gap Dl.

In an embodiment, the third minimum gap D3 may be less than or equal to the first minimum gap D1, and may be greater than the second minimum gap D2. In other words, a value obtained by subtracting the width PW3 of the third pixel opening POP3 from the width RW3 of the third refractive opening ROP3 may be less than or equal to a value obtained by subtracting the width PW1 of the first pixel opening POP1 from the width RW1 of the first refractive opening ROP1, and the value obtained by subtracting the width PW3 of the third pixel opening POP3 from the width RW3 of the third refractive opening ROP3 may be greater than a value obtained by subtracting the width PW2 of the second pixel opening POP2 from the width RW2 of the second refractive opening ROP2. In the embodiment shown in FIG. 10 (e.g., a first embodiment), the first minimum gap D1, the second minimum gap D2, and the third minimum gap D3 may be equal to about 0.0 μm, about –0.5 μm, and about 0.0 μm, respectively. In the embodiment shown in FIG. 11 (e.g., a second embodiment), the first minimum gap D1, the second minimum gap D2, and the third minimum gap D3 may be equal to about 0.5 μm, about –0.5 μm, and about 0.0 μm, respectively.

Figure 10:
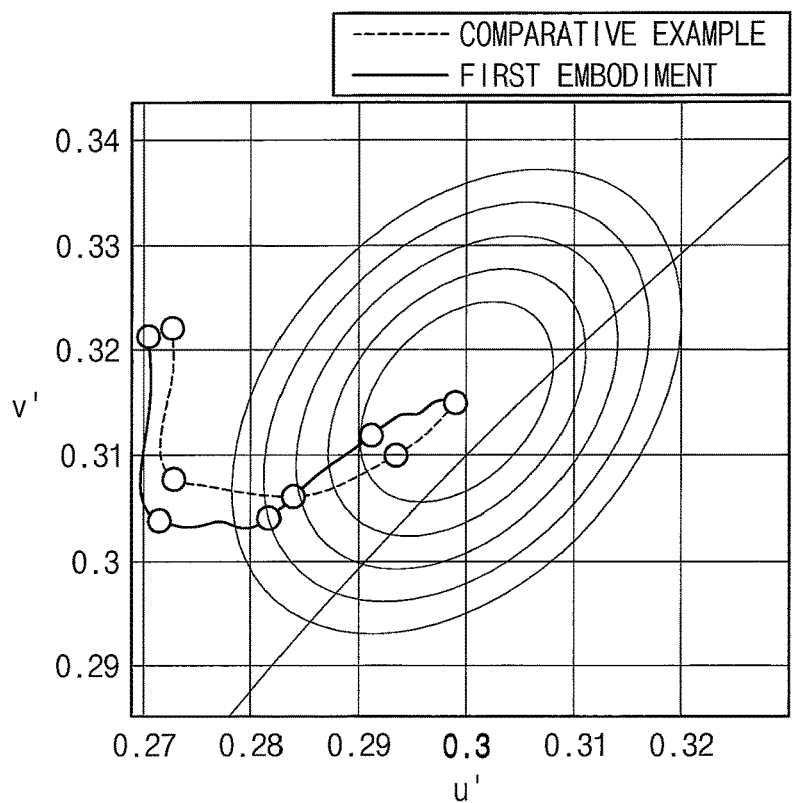
FIG. 10 is a diagram illustrating a white angular dependency according to a viewing angle in an embodiment.

FIG. 10 is a diagram illustrating a white angular dependency according to a viewing angle in the first embodiment. FIG. 11 is a diagram illustrating a white angular dependency according to a viewing angle in the second embodiment.

Figure 11:
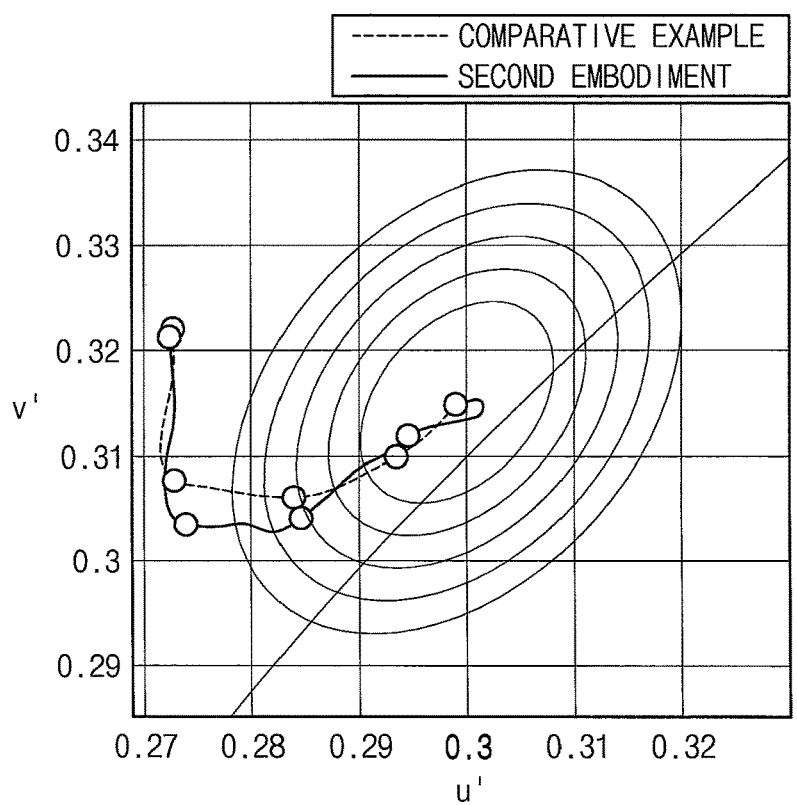
FIG. 11 is a diagram illustrating a white angular dependency according to a viewing angle in another embodiment.

Referring to FIGS. 10 and 11, a maximum color shift (Δu'v') in a viewing angle from about 0 degree to about 60 degree is about 0.018 according to a comparative example in which the first refractive layer is not formed, a maximum color shift (Δu'v') in a viewing angle from about 0 degree to about 60 degree is about 0.019 according to the first embodiment, and a maximum color shift (Δu'v') in a viewing angle from about 0 degree to about 60 degree is about 0.017 according to the second embodiment. Accordingly, the white angular dependency according to the viewing angle in the first embodiment and the white angular dependency according to the viewing angle in the second embodiment are similar to (e.g., are not much different from) the white angular dependency according to the viewing angle in the comparative example. Therefore, at least one of the first minimum gap D1, the second minimum gap D2, and the third minimum gap D3 may be different from the others, so that the increase of the white angular dependency according to the viewing angle may be prevented or substantially prevented.

The display device according to one or more embodiments of the present disclosure may be applied to a display device included in a computer, a notebook, a mobile phone, a smartphone, a smart pad, a PMP, a PDA, an MP3 player, and/or the like.

Although some example embodiments have been described, those skilled in the art will readily appreciate that various modifications are possible in the example embodiments without departing from the spirit and scope of the present disclosure. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device, comprising:
a pixel electrode;
a pixel defining layer on the pixel electrode, and having a pixel opening that exposes at least a portion of the pixel electrode;
an emission layer on the pixel electrode at the pixel opening;
an opposite electrode on the emission layer;
an input sensing layer on the opposite electrode;
a first refractive layer on the opposite electrode and covering the input sensing layer, the first refractive layer having a first refractive index, and a refractive opening that overlaps with the pixel opening; and
a second refractive layer on the first refractive layer, and having a second refractive index greater than the first refractive index,
wherein a minimum gap between the pixel opening and the refractive opening in a plan view is greater than or equal to –1 μm and less than or equal to 2.5 μm, and
wherein a width of the refractive opening is less than a width of the pixel opening when the minimum gap is negative, and the width of the refractive opening is greater than the width of the pixel opening when the minimum gap is positive.

2. The display device of claim 1, wherein a value obtained by subtracting the width of the pixel opening from the width of the refractive opening is greater than or equal to –2 μm and less than or equal to 5 μm.

3. The display device of claim 1, wherein the refractive opening has a planar shape same as a planar shape of the pixel opening.

4. The display device of claim 1, wherein the first refractive layer comprises a photoresist.

5. The display device of claim 1, wherein the first refractive layer comprises acrylic resin.

6. The display device of claim 1, wherein the second refractive layer comprises siloxane, and at least one from among zirconium oxide, aluminum oxide, and titanium oxide.

7. The display device of claim 1, wherein an upper surface of the second refractive layer is planarized.

8. The display device of claim 1, further comprising:
a thin film encapsulation layer between the opposite electrode and the first refractive layer, and comprising a planarized upper surface.

9. The display device of claim 8,
wherein the input sensing layer is located between the thin film encapsulation layer and the first refractive layer.

10. The display device of claim 1, further comprising:
a polarizing layer on the second refractive layer.

11. A display device, comprising:
first to third pixel electrodes;
a pixel defining layer on the first to third pixel electrodes, and having first to third pixel openings that expose the first to third pixel electrodes, respectively;
first to third emission layers on the first to third pixel electrodes at the first to third pixel openings, respectively;
an opposite electrode on the first to third emission layers;
a first refractive layer on the opposite electrode, and having a first refractive index, and first to third refractive openings overlapping with the first to third pixel openings, respectively; and
a second refractive layer on the first refractive layer and having a second refractive index greater than the first refractive index,
wherein each of a first minimum gap between the first pixel opening and the first refractive opening in a plan view, a second minimum gap between the second pixel opening and the second refractive opening in a plan view, and a third minimum gap between the third pixel opening and the third refractive opening in a plan view is greater than or equal to –1 μm and less than or equal to 2.5 μm,
wherein a width of each of the first to third refractive openings is less than a width of each of the first to third pixel openings corresponding thereto when the first to third minimum gaps are negative, and the width of each of the first to third refractive openings is greater than the width of each of the first to third pixel openings corresponding thereto when the first to third minimum gaps are positive, and wherein at least one from among the first minimum gap, the second minimum gap, and the third minimum gap is different from the others.

12. The display device of claim 11, wherein the first emission layer, the second emission layer, and the third emission layer are configured to emit a red light, a green light, and a blue light, respectively.

13. The display device of claim 12, wherein the second minimum gap is less than the first minimum gap.

14. The display device of claim 12, wherein the third minimum gap is greater than the second minimum gap.

15. The display device of claim 12, wherein the third minimum gap is less than or equal to the first minimum gap.

16. The display device of claim 11, wherein each of a value obtained by subtracting the width of the first pixel opening from the width of the first refractive opening, a value obtained by subtracting the width of the second pixel opening from the width of the second refractive opening, and a value obtained by subtracting the width of the third pixel opening from the width of the third refractive opening is greater than or equal to −2 μm and less than or equal to 5 μm.

17. The display device of claim 11, wherein each of the first to third refractive openings has a planar shape same as a planar shape of each of the first to third pixel openings corresponding thereto.

18. A display device, comprising:

a light emitting element;

a pixel defining layer surrounding the light emitting element;

a first refractive layer on the light emitting element and the pixel defining layer, the first refractive layer overlapping with the pixel defining layer, and having a first refractive index; and a second refractive layer on the first refractive layer, the second refractive layer overlapping with the light emitting element and the pixel defining layer, and having a second refractive index greater than the first refractive index, wherein an edge of the pixel defining layer is spaced from an edge of the first refractive layer in a plan view, and wherein a width of the first refractive layer is greater than a width of the pixel defining layer.

19. The display device of claim 18, wherein a value obtained by subtracting the width of the first refractive layer from the width of the pixel defining layer is greater than or equal to −2 μm and less than or equal to 5 μm.

* * * * *